(12) United States Patent
Mochida

(10) Patent No.: US 9,515,614 B2
(45) Date of Patent: Dec. 6, 2016

(54) AMPLIFIER DEVICE AND WIRELESS COMMUNICATION DEVICE

(71) Applicant: SUMITOMO ELECTRIC INDUSTRIES, LTD., Osaka-shi, Osaka (JP)

(72) Inventor: Eiji Mochida, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/770,936

(22) PCT Filed: Sep. 12, 2014

(86) PCT No.: PCT/IB2014/001788
§ 371 (c)(1),
(2) Date: Aug. 27, 2015

(87) PCT Pub. No.: WO2015/011561
PCT Pub. Date: Jan. 29, 2015

(65) Prior Publication Data
US 2016/0013764 A1    Jan. 14, 2016

(30) Foreign Application Priority Data

Jul. 19, 2013    (JP) ................. 2013-150677

(51) Int. Cl.
*H03F 1/26*        (2006.01)
*H03F 1/32*        (2006.01)
(Continued)

(52) U.S. Cl.
CPC ............. *H03F 1/32* (2013.01); *H03F 1/3247* (2013.01); *H03F 1/3258* (2013.01); *H03F 3/19* (2013.01);
(Continued)

(58) Field of Classification Search
CPC ........ H03F 1/32; H03F 3/19; H03F 2200/451; H03F 2201/3212; H03F 1/3247; H03F 3/245; H03F 1/3258; H03F 2200/207; H03F 2200/105; H03F 2200/336
(Continued)

(56) References Cited

U.S. PATENT DOCUMENTS 5,105,445 A * 4/1992 Karam ................. H03F 1/3247
330/149
6,552,609 B2    4/2003 Hamada et al.
(Continued)

FOREIGN PATENT DOCUMENTS

JP    2002-111401 A    4/2002
JP    2010-147983 A    7/2010
JP    2010-219818 A    9/2010

*Primary Examiner* — Steven J Mottola
*Assistant Examiner* — Hafizur Rahman
(74) *Attorney, Agent, or Firm* — Drinker Biddle & Reath LLP

(57) ABSTRACT

An amplifier device 1 includes: a distortion compensation section 3 that performs distortion compensation for an input signal x to an amplifier 2 by digital signal processing; and a separation section 9 that separates an output signal from the amplifier 2 into an I signal as an analog signal component including phase information of the output signal and an analog signal component including power information of the output signal. The distortion compensation section 3 performs distortion compensation for the amplifier 2, based on 1-bit signals obtained by expressing, in 1 bit, the analog I signal and the analog signal component including the power information of the output signal, respectively.

8 Claims, 8 Drawing Sheets

(51) Int. Cl.
*H03F 3/24*     (2006.01)
*H03F 3/19*     (2006.01)

(52) U.S. Cl.
CPC ......... *H03F 3/245* (2013.01); *H03F 2200/105* (2013.01); *H03F 2200/207* (2013.01); *H03F 2200/336* (2013.01); *H03F 2200/451* (2013.01); *H03F 2201/3212* (2013.01)

(58) Field of Classification Search
USPC ....... 330/148, 149; 375/296, 297; 455/114.3
See application file for complete search history.

(56) References Cited

U.S. PATENT DOCUMENTS

| | | | |
|---|---|---|---|
| 6,985,033 B1 * | 1/2006 | Shirali | ................ H03F 1/3247 330/149 |
| 8,351,875 B2 | 1/2013 | Kato et al. | |
| 2011/0319113 A1 | 12/2011 | Takeda et al. | |

* cited by examiner

AMPLIFIER DEVICE AND WIRELESS COMMUNICATION DEVICE

TECHNICAL FIELD

The present invention relates to amplifier devices and wireless communication devices.

BACKGROUND ART

In recent years, in a wireless communication system used for mobile phones and the like, a high-speed and broadband communication scheme such as long term evolution (LTE) has been widespread (refer to PATENT LITERATURE 1, for example).

CITATION LIST

Patent Literature

PATENT LITERATURE 1: Japanese Laid-Open Patent Publication No. 2010-219818

SUMMARY OF INVENTION

Technical Problem

In the LTE, the maximum usable bandwidth of the system has been about 20 MHz. In LTE-A (Advanced), which is a subsequent evolution of the LTE, it is scheduled that the maximum usable bandwidth of the system is extended to about 100 MHz.

Therefore, an amplifier device included in a base station device used in the wireless communication system also needs to cope with such broadening of bandwidth, and there is concern that component costs might be increased due to the broadening of bandwidth.

Meanwhile, in the LTE-A, small cells are actively introduced in order to increase the communication capacity. Therefore, a small, lightweight and low-cost amplifier device has been demanded as an amplifier device to be used in a small base station device corresponding to each small cell.

In the amplifier device for the small base station device corresponding to the small cell, further cost reduction is desired in spite of the concern that the broadening of bandwidth due to adaptation of the LTE-A might increase the component costs.

The present invention has been made in view of the above-described circumstance, and an object of the present invention is to provide an amplifier device and a wireless communication device which enable further cost reduction.

Solution to Problem

An amplifier device according to an embodiment of the present invention includes: an amplifier; a distortion compensation section configured to perform distortion compensation for an input signal to the amplifier by digital signal processing; and a separation section configured to separate an output signal from the amplifier into an analog signal component including phase information of the output signal, and an analog signal component including power information of the output signal. The distortion compensation section performs the distortion compensation for the amplifier, based on 1-bit signals obtained by expressing, in 1 bit, the analog signal component including the phase information of the output signal and the analog signal component including the power information of the output signal, respectively.

Further, an amplifier device according to an embodiment of the present invention includes: an amplifier; a distortion compensation section configured to perform distortion compensation for an input signal to the amplifier by digital signal processing; and a separation section configured to separate an output signal from the amplifier into a component of an analog I signal, and a component of an analog signal other than the analog I signal. The distortion compensation section performs the distortion compensation for the amplifier, based on 1-bit signals obtained by expressing, in 1 bit, the analog I signal and the other analog signal, respectively.

A wireless communication device according to an embodiment of the present invention includes the above-described amplifier device for amplification of a communication signal.

Advantageous Effects of Invention

According to the amplifier device and the wireless communication device of the present invention, further cost reduction can be realized.

DESCRIPTION OF EMBODIMENTS

Description of Embodiment of Present Invention

Figure 1:
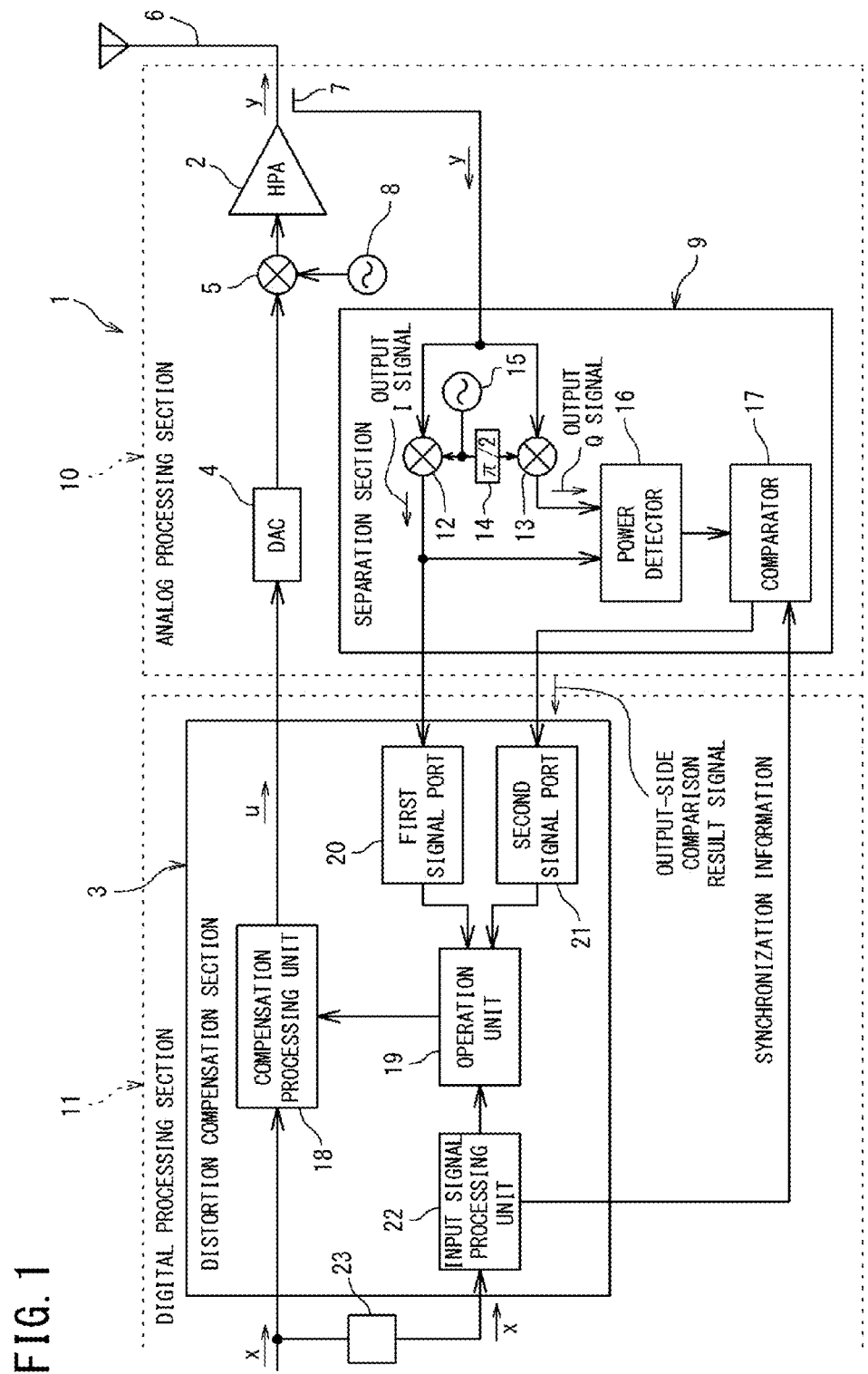
FIG. 1 is a block diagram illustrating a major part of a wireless communication device including an amplifier device according to an embodiment.

An amplifier device used in a base station device or the like in a wireless communication system generally includes a distortion compensation device that performs distortion compensation for an amplifier by digital signal processing. Since the distortion compensation device receives an analog output signal from an amplifier as a feedback signal, the distortion compensation device includes an A/D converter for converting the analog output signal into a digital signal. The larger the bandwidth of the output signal to be converted by the A/D converter, the higher the sampling frequency of the A/D converter should be. Therefore, the cost of the A/D converter might be increased due to broadening of bandwidth.

The inventor of the present invention has noticed this point to complete the invention.

First, features of an embodiment of the present embodiment will be listed below.

(1) An amplifier device according to an embodiment of the present invention includes: an amplifier; a distortion compensation section configured to perform distortion compensation for an input signal to the amplifier by digital signal processing; and a separation section configured to separate an output signal from the amplifier into an analog signal component including phase information of the output signal, and an analog signal component including power information of the output signal. The distortion compensation section performs the distortion compensation for the amplifier, based on 1-bit signals obtained by expressing, in 1 bit, the analog signal component including the phase information of the output signal and the analog signal component including the power information of the output signal, respectively.

According to the amplifier device configured as described above, the distortion compensation section performs distortion compensation for the amplifier, based on the 1-bit signals obtained by expressing, in 1 bit, the analog signal component including the phase information of the output signal and the analog signal component including the power information of the output signal, respectively. Therefore, the distortion compensation section can perform the distortion compensation without using an A/D converter for converting the analog output signal into a digital signal. As a result, since an A/D converter that causes an increase in cost need not be used even when a broadband signal is processed, cost reduction can be achieved.

(2) Further, in the amplifier device, preferably, the separation section includes: a power detector configured to detect power of the output signal; and a comparator configured to output a comparison result signal indicating a result of comparison between the power of the output signal and a comparison value set for comparison with the output signal, as the analog signal component including the power information of the output signal. Preferably, the comparator temporally varies the comparison value within a predetermined numerical value range.

The comparison result signal indicates the magnitude of the power of the output signal when the comparison value is set as a reference. Therefore, if the comparison result signal of the output signal is compared with the comparison result signal of the input signal corresponding to the comparison result signal of the output signal, it is possible to know the degree of approximation between the power of the output signal and the power of the input signal with the comparison value set as a reference.

Furthermore, since the comparator temporally varies the comparison value as a reference within the predetermined numerical value range, it is possible to know the degree of approximation between the power of the output signal and the power of the input signal in the predetermined numerical value range.

Therefore, the distortion compensation section can obtain, from the comparison result signal of the output signal, information relating to the power of the output signal which allows the distortion compensation section to know the degree of approximation with the power of the input signal.

As described above, the separation section can output the comparison result signal as the analog signal component including the power information of the output signal.

(3) Further, in the amplifier device, the comparator may vary the comparison value cyclically in the same pattern.

In this case, since the comparison value of the comparator is determined by the cycle of the pattern, it is easy to synchronize the comparison values between the comparator and the distortion compensation section.

(4) Preferably, in the pattern for cyclically varying the comparison value, a plurality of retention periods each for retaining the comparison value constant during a predetermined time period are provided in each cycle, and different comparison values are set for the respective retention periods.

In the above configuration, in each retention period, more comparison result signals can be obtained under the condition that the comparison value is constant, and thereby the accuracy of the information relating to the power of the output signal can be further improved.

When the comparison value is changed from a value to another value, the change in the actual value may be delayed with respect to the change in the value to be set, which may cause error in the comparison value. In this regard, according to the above configuration, since the retention periods each for retaining the comparison value constant during the predetermined time period are provided, the comparison value can be made stable and free from error in the middle of each retention period. Therefore, by excluding signals included in a part of the retention period where error occurs in the comparison value, and using, for processing, only signals in the other part of the retention period, it is possible to prevent the comparison result signal obtained by using the comparison value including the error from being outputted. As a result, the accuracy of the distortion compensation can be further improved.

(5), (6) In the amplifier device, the analog signal component including the phase information of the output signal may be composed of a signal which does not include another signal component intersecting on a complex plane, or may be an analog I signal or an analog Q signal.

In this case, the distortion compensation section can obtain at least the information relating to the phase of the output signal, by the 1-bit signal obtained by expressing, in 1 bit, the analog I signal or the analog Q signal. Therefore, if only the distortion compensation section obtains the information relating to the phase of the input signal, the distortion compensation section can obtain information relating to a phase difference between the output signal and the input signal, and can perform distortion compensation based on the information relating to the phase difference.

(7) Further, an amplifier device according to an embodiment of the present invention includes: an amplifier; a distortion compensation section configured to perform distortion compensation for an input signal to the amplifier by digital signal processing; and a separation section configured to separate an output signal from the amplifier into a component of an analog I signal, and a component of an analog signal other than the analog I signal. The distortion compensation section performs the distortion compensation for the amplifier, based on 1-bit signals obtained by expressing, in 1 bit, the analog I signal and the other analog signal, respectively.

According to the amplifier device configured as described above, the distortion compensation section can obtain at least the information relating to the phase of the output signal, based on the 1-bit signal obtained by expressing the analog I signal in 1 bit, and can perform distortion compensation based on the information.

Further, since the distortion compensation section performs the distortion compensation for the amplifier, based on the 1-bit signals obtained by expressing, in 1 bit, the analog I signal and the other analog signal, respectively, the distortion compensation section can perform the distortion compensation without using an A/D converter for converting the analog output signal into a digital signal. As a result, since an A/D converter that causes an increase in cost need not be used even when a broadband signal is processed, cost reduction can be achieved.

(8) Further, a wireless communication device according to another embodiment of the present invention includes the amplifier device according to the above (1) or (7) for amplification of a communication signal.

Details of Embodiment of Present Invention

Hereinafter, preferable embodiments will be described with reference to the drawings.

1. Overall Configuration of Amplifier Device

FIG. 1 is a block diagram illustrating a major part of a wireless communication device including an amplifier device according to the embodiment. In FIG. 1, the wireless communication device includes an amplifier device 1 for amplifying a transmission signal to be transmitted as a radio signal. The amplifier device 1 may be used for amplification of a received signal.

The amplifier device 1 includes a high-power amplifier (HPA; hereinafter also referred to simply as an amplifier) 2, and a distortion compensation section (distortion compensation device) 3.

The distortion compensation section 3 has a function of performing distortion compensation by digital signal processing on a signal x which is a transmission signal provided as a digital signal. The distortion compensation section 3 outputs a compensated signal u as a result of the distortion compensation.

A D/A converter (DAC) 4 for converting a digital signal into an analog signal and an up-converter 5 are connected between the distortion compensation section 3 and a signal input terminal of the amplifier 2.

The compensated signal u outputted from the distortion compensation section 3 is provided to the DAC 4, and converted into an analog signal. Then, the analog signal is provided to the up-converter 5, and multiplied by a local signal having a radio frequency generated by an oscillator 8 to be up-converted into a radio frequency signal. The radio-frequency signal is provided to the amplifier 2.

The amplifier 2 amplifies the inputted compensated signal u. An antenna 6 is connected to a signal output terminal of the amplifier 2, and an output signal y from the amplifier 2 is emitted through the antenna 6 as a radio transmission signal.

A coupler 7 for receiving the output signal y outputted from the amplifier 2, and a separation section 9 are connected between the signal output terminal of the amplifier 2 and the distortion compensation section 3.

The output signal y from the amplifier 2, which is outputted from the coupler 7, is provided to the separation section 9.

Upon being provided with the analog output signal y outputted from the amplifier 2, the separation section 9 separates the output signal y into a component corresponding to an analog I signal (an analog signal component including phase information of the output signal y), and an output-side comparison result signal as a component corresponding to an analog signal other than the analog I signal (an analog signal component including power information of the output signal y), and outputs both the separated analog signal components to the distortion compensation section 3. The output-side comparison result signal will be described later.

The DAC 4, the up-converter 5, the amplifier 2, the antenna 6, the coupler 7, and the separation section 9 are included in an analog processing section 10 that receives the compensated signal u as a digital signal, converts the digital signal into an analog signal, and performs necessary analog signal processing on the analog signal.

The distortion compensation section 3 is included in a digital processing section 11 that outputs the digital signal to be processed by the analog processing section 10.

The distortion compensation section 3 is provided with the signal x as an input signal to the amplifier 2, and the analog output I signal and the output-side comparison result signal which have been separated by the separation section 9. Based on these signals, the distortion compensation section 3 estimates input-output characteristics of the amplifier 2, and performs distortion compensation for the signal x by digital signal processing.

2. Separation Section

As described above, the separation section 9 has the function of separating the analog output signal y outputted from the amplifier 2 into the analog I signal component and the output-side comparison result signal.

The separation section 9 includes a first down-converter 12, a second down-converter 13, a phase shifter 14, a power detector 16, and a comparator 17.

The first down-converter 12 is provided with the analog output signal y, and a local signal having a baseband frequency generated by an oscillator 15.

The first down-converter 12 multiplies the analog output signal y by the local signal having the baseband frequency to output an I signal which is an in-phase component (output I signal).

The second down-converter 13 is provided with the analog output signal y, and a local signal whose phase is 90° shifted with respect to a signal provided to the first down-converter 12, by the phase shifter 14.

The second down-converter 13 multiplies the analog output signal y by the local signal whose phase is 90° shifted with respect to the signal provided to the first down-converter 12, thereby outputting a Q signal which is a quadrature component (output Q signal).

The first down-converter 12 provides the output I signal to the power detector 16 and the distortion compensation section 3.

The second down-converter 13 provides the output Q signal to the power detector 16.

Upon being provided with the output I signal and the output Q signal, the power detector 16 detects the power of the output signal y. The power detector 16 provides information indicating the detected power to the comparator 17.

Upon being provided with the information indicating the power of the output signal y from the power detector 16, the comparator 17 compares the power of the output signal y with an offset value (comparison value) set for comparison with the power of the output signal y, and outputs an output-side comparison result signal indicating the result of the comparison, to the distortion compensation section 3.

Thus, the separation section 9 outputs the analog output I signal and the analog output-side comparison result signal to the distortion compensation section 3.

The comparator 17 calculates the output-side comparison result signal, based on the following formula (1):

$$\text{output-side comparison result signal } f(P_y(t),t) = P_y(t) - V(t) \quad (1)$$

In the above formula (1), $P_y(t)$ represents the power of the output signal y at time t, which is expressed by a square sum of the output I signal and the output Q signal. In addition, $V(t)$ represents (a pattern of) the offset value at time t. The comparator 17 varies the offset value temporally within a predetermined numerical value range.

Figure 2:
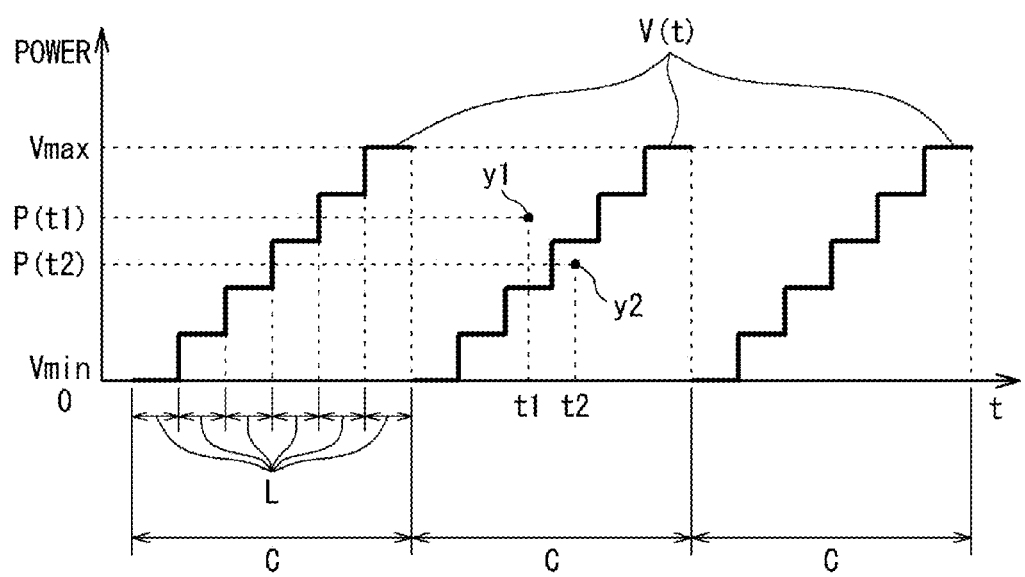
FIG. 2 is a graph schematically illustrating an example of a relationship between an offset value and time.

FIG. 2 is a graph schematically illustrating an example of a relationship between the offset value and time. In FIG. 2, the horizontal axis represents time, and the vertical axis represents power.

A minimum value Vmin of the offset value is set to "0", for example, and a maximum value Vmax thereof is set to a maximum power value that the amplifier 2 can output, for example. The offset value is set within the numerical value range from the minimum value Vmin to the maximum value Vmax.

As shown in FIG. 2, the offset value is set in accordance with the pattern V(t). The pattern V(t) of the offset value is set as follows. That is, as shown in FIG. 2, a plurality of retention periods L each for retaining the offset value constant for a predetermined time period are provided in one cycle C, and the offset value in each retention period L is increased stepwise with elapse of time within the above-described numerical value range. Thus, different offset values are set for the respective retention periods L.

The comparator 17 sets the offset value in accordance with the pattern V(t) so as to vary the offset value cyclically in the same pattern V(t) within the above-described numerical value range.

The lengths of the respective retention periods L are set to be equal to each other. The length of each retention period L is set to a time length which allows several thousands of samples to exist therein when the signal x as a digital signal is applied to the pattern shown in FIG. 2.

In FIG. 2, in the numerical value range from the minimum value Vmin to the maximum value Vmax, six retention periods I, are provided so as to increase the offset value in six stages. However, actually, the number of stages represented by the retention periods L is much larger than six (for example, sixteen stages).

Thus, the comparator 17 can obtain the information relating to the power in finer units, thereby improving estimation accuracy for a model indicating input-output characteristics of the amplifier 2, which will be estimated later in calculation by the distortion compensation section 3.

Further, the comparator 17 sets the cycle C of the pattern V(t) of the offset value to several Hz, for example. The comparator 17 determines timing to start the pattern V(t) of the offset value, based on synchronization information provided from a later-described input signal processing unit 22 in the distortion compensation section 3.

The comparator 17 generates the offset value in accordance with the pattern V(t) shown in FIG. 2, and calculates the output-side comparison result signal, between the offset value and the power $P(t)$ of the output signal y provided from the power detector 16, in accordance with the formula (1).

As shown in FIG. 2, assuming that the power of the output signal y1 when time t is t1 is P(t1) which is greater than the offset value V(t1), the output-side comparison result signal has a positive value.

Assuming that the power of the output signal y2 when time t is t2 is P(t2) which is smaller than the offset value V(t2), the output-side comparison result signal has a negative value.

Thus, in the present embodiment, the output-side comparison result signal represents, depending on whether its value is positive or negative, the comparison result between the offset value V(t) and the power of the output signal y. That is, when the output-side comparison result signal has a positive value, the power P(t) of the output signal y is greater than the offset value V(t). When the output-side comparison result signal has a negative value, the power P(t) of the output signal y is smaller than the offset value V(t).

As described above, the separation section 9 separates the analog output signal y outputted from the amplifier 2 into the analog I signal component outputted from the first down-converter 12, and the output-side comparison result signal outputted from the comparator 17.

3. Distortion Compensation Section

Referring back to FIG. 1, the distortion compensation section 3 includes: a compensation processing unit 18 that performs predistortion on the signal x; an operation unit 19 that estimates a model representing input-output characteristics of the amplifier 2; first and second signal ports 20 and 21 provided with the analog signals from the separation section 9; and the input signal processing unit 22 that preforms a process relating to the signal x.

The distortion compensation section 3 receives, as feedback signals, the output I signal and the output-side comparison result signal which are outputted from the separation section 9, and performs distortion compensation for the amplifier 2 based on these signals.

The first signal port 20 has a function of receiving the output I signal provided from the separation section 9.

The first signal port 20 receives the output I signal as an analog signal provided from the separation section 9 after adjusting the amplitude thereof so as to be suitable for processing in the digital processing section 11, and compares the output I signal with a preset comparison value, thereby outputting a 1-bit digital signal. The first signal port 20 is composed of, for example, a comparator or the like that compares the output I signal with the comparison value to output the 1-bit digital signal.

In the present embodiment, the first signal port 20 outputs a signal including "+1" or "−1" as sign information, based on the output I signal. The signal outputted from the first signal port 20 is a 1-bit signal obtained by expressing the output I signal in 1 bit.

The first signal port 20 provides the operation unit 19 with a digital signal corresponding to the output I signal expressed in 1 bit (a 1-bit signal of the output I signal).

The output I signal may be adjusted to have an amplitude suitable for processing in the digital processing section 11, in the stage preceding the first signal port 20.

The second signal port 21 has a function of receiving the output-side comparison result signal provided from the comparator 17 in the separation section 9. The second signal port 21 receives the output-side comparison result signal as an analog signal provided from the comparator 17 after adjusting the amplitude thereof so as to be suitable for processing in the digital processing section 11, and compares the output-side comparison result signal with a preset comparison value, thereby outputting a 1-bit digital signal.

The second signal port 21 is composed of, for example, a comparator or the like that compares the output-side comparison result signal with the comparison value to output the 1-bit digital signal.

The second signal port 21 outputs a signal including "+1" or "−1" as sign information, based on the output-side comparison result signal. The signal outputted from the second signal port 21 is a 1-bit signal obtained by expressing the output-side comparison result signal in 1 bit.

The output-side comparison result signal represents, depending on whether its value is positive or negative, the comparison result between the offset value V(t) and the power of the output signal y. Therefore, the second signal port 21 outputs the signal so that the sign information becomes "+1" when the value of the output-side comparison result signal is positive, and outputs the signal so that the sign information becomes "−1" when the output-side comparison result signal is negative.

Thus, information relating to the comparison result of the comparator 17 is included in the 1-bit digital signal based on the output-side comparison result signal, which is outputted from the second signal port 21.

The second signal port 21 provides the operation unit 19 with a digital signal corresponding to the output-side comparison result signal expressed in 1 bit (a 1-bit signal of the output-side comparison result signal).

The output-side comparison result signal may be adjusted to have an amplitude suitable for processing in the digital processing section 11, in the stage preceding the second signal port 21.

As described above, the output I signal and the output-side comparison result signal outputted from the separation section 9 are expressed as the 1-bit signal of the output I signal and the 1-bit signal of the output-side comparison result signal, which are 1-bit digital signals, by the first signal port 20 and the second signal port 21, respectively, and then provided to the operation unit 19.

The operation unit 19 is provided with, in addition to the 1-bit signal of the output I signal and the 1-bit signal of the output-side comparison result signal (hereinafter, also collectively referred to as "output-side 1-bit signal") obtained by expressing, as 1-bit digital signals, the output I signal and the output-side comparison result signal which are received as feedback signals, respectively, an input-side 1-bit signal corresponding to the output-side 1-bit signal, from the input signal processing unit 22.

The operation unit 19 estimates an inverse model representing inverse characteristics of the input-output characteristics of the amplifier 2, based on the output-side 1-bit signal and the input-side 1-bit signal. However, the model of the amplifier 2 estimated by the operation unit 19 is not necessarily an inverse model, but may be a forward model.

The compensation processing unit 18 performs distortion compensation for the signal x, based on the inverse model of the amplifier 2 estimated by the operation unit 19, and outputs a distortion-compensated signal u. The compensation processing unit 18 provides the amplifier 2 having distortion characteristics with the compensated signal u obtained based on the inverse characteristics to the distortion characteristics of the amplifier 2, thereby causing the amplifier 2 to output the distortion-suppressed output signal y.

The input-output characteristics of the amplifier 2 are non-linear characteristics, and the model representing the input-output characteristics of the amplifier 2 can be expressed by a power series, for example.

The operation unit 19 of the present embodiment estimates the inverse model of the amplifier 2, as a power series, based on the output-side 1-bit signal and the input-side 1-bit signal. That is, the operation unit 19 estimates a coefficient of each order of the power series which represents the inverse model, as a distortion compensation factor for compensating for distortion of the amplifier 2.

The operation unit 19 provides the compensation processing unit 18 with the estimated value of the coefficient of each order (distortion compensation coefficient). The process performed by the operation unit 19 will be described later in detail.

Upon being provided with the estimated coefficient of each order, the compensation processing unit 18 updates the coefficient of each order of the inverse model expressed by the power series, and thereafter, performs distortion compensation for the signal x to output the distortion-compensated signal u.

Since the compensation processing unit 18 is provided with the estimated value of the coefficient of each order from the operation unit 19 at any time, the compensation processing unit 18 can update the coefficient of each order of the inverse model at any time to perform distortion compensation appropriate for the current input-output characteristics.

As described above, the operation unit 19 estimates the inverse model of the amplifier 2 as a power series, based on the output-side 1-bit signal and the input-side 1-bit signal.

As described above, the input-side 1-bit signal is provided from the input signal processing unit 22.

The input signal processing unit 22 has a function of performing, as digital processing, the same functions as those of the first down-converter 12, the second down-converter 13, the power detector 16, and the comparator 17 in the separation section 9.

Therefore, the input signal processing unit 22 receives the signal x as an input signal, and outputs the input-side 1-bit signal (the 1-bit signal of the input I signal and the 1-bit signal of the input-side comparison result signal) based on the signal x.

The 1-bit signal of the input I signal is an input-side signal corresponding to the 1-bit signal of the output I signal which is outputted from the first signal port 20.

The 1-bit signal of the input-side comparison result signal is an input-side signal corresponding to the 1-bit signal of the output-side comparison result signal which is outputted from the second signal port 21.

The input signal processing unit 22 extracts the I signal (input I signal) from the signal x, and converts the input I signal into a 1-bit signal (a 1-bit signal of the input I signal) in a similar manner to that for the 1-bit signal of the output I signal, and provides the 1-bit signal to the operation unit 19. At this time, the input signal processing unit 22 performs a process similar to the process performed by the first signal port 20 to obtain the 1-bit signal from the output I signal.

Further, the input signal processing unit 22 executes, based on the signal x, a process similar to the process performed by the separation section 9 to obtain the output-side comparison result signal by using the output I signal and the output Q signal.

That is, the input signal processing unit 22 sets an offset value in accordance with the pattern V(t) shown in FIG. 2, and compares the power of the signal x with the offset value to obtain an input-side comparison result signal based on the power of the signal x.

Further, the input signal processing unit 22 converts the input-side comparison result signal into a 1-bit signal, and provides the 1-bit signal to the operation unit 19.

As described above, the input signal processing unit 22 provides the operation unit 19 with the input-side 1-bit signal (the 1-bit signal of the input I signal and the 1-bit signal of the input-side comparison result signal) corresponding to the output-side 1-bit signal (the 1-bit signal of the output I signal and the 1-bit signal of the output-side comparison result signal).

The output-side 1-bit signal and the input-side 1-bit signal are provided to the operation unit 19 so that the output signal y used for obtaining the output-side 1-bit signal and the input signal x used for obtaining the input-side 1-bit signal correspond to each other. Therefore, a delay adjustment section 23 is disposed in the stage preceding the input signal processing unit 22. In the delay adjustment section 23, the signal x to be processed in the input signal processing unit 22 and the output signal y to be processed in the separation section 9 are adjusted to correspond to each other.

The input signal processing unit 22 needs to make the timing of the pattern V(t) of the offset value shown in FIG. 2 coincide with that of the comparator 17 in the separation section 9. For this purpose, the input signal processing unit 22 transmits, to the comparator 17, synchronization information indicating start timing of the pattern V(t). Upon receiving the synchronization information, the comparator 17 determines start timing of the pattern V(t) based on the synchronization information. Thereby, the pattern V(t) of the offset value set by the input signal processing unit 22 and the pattern V(t) of the offset value set by the comparator 17 can be made to coincide with each other.

As described above, in the present embodiment, since the offset value is cyclically varied in accordance with the pattern V(t), the offset value in the comparator 17 is determined based on the cycle of the pattern V(t). Therefore, if only the start timing of the pattern V(t) is determined, the offset value in the comparator 17 and the offset value in the distortion compensation section 3 can be easily synchronized with each other.

Upon being provided with the output-side 1-bit signal and the input-side 1-bit signal corresponding to the output-side 1-bit signal, the operation unit 19 calculates a residual represented by the following formula (2), for each cycle C (FIG. 2) of the pattern V(t) of the offset value.

$$\text{residual} = [f(P_y(t),t)] \cdot [y_{Ich}(t)] - [f(P_x(t),t)] \cdot [x_{Ich}(t)] \quad (2)$$

In the formula (2), $[f(P_y(t),t)]$ represents a signal obtained by expressing the output-side comparison result signal as a 1-bit signal by the first signal port 20 (a 1-bit signal of the output-side comparison result signal), and this signal is represented by "+1" or "−1".

In the formula (2), $[y_{Ich}(t)]$ represents a 1-bit signal of the output I signal, and this signal is represented by "+1" or "−1".

Further, $[f(P_x(t),t)]$ represents a signal obtained by expressing the input-side comparison result signal as a 1-bit signal (a 1-bit signal of the input-side comparison result signal), and this signal is represented by "+1" or "−1".

Further, $[x_{Ich}(t)]$ represents a 1-bit signal of the input I signal, and this signal is represented by "+1" or "−1".

The operation unit 19 calculates a residual shown in the formula (2). Next, the operation unit 19 calculates a coefficient of each order of the inverse model, which can minimize a mean square value of the residual, by using the above-described inverse model as a regression equation.

After the calculation of the coefficient of each order, the operation unit 19 provides the compensation processing unit 18 with the calculated coefficient of each order as an estimated value. The compensation processing unit 18 performs distortion compensation based on the estimated coefficient of each order, and outputs a distortion-compensated signal u.

4. Effects

According to the amplifier device 1 of the present embodiment, the distortion compensation section 3 performs distortion compensation for the amplifier 2, based on the 1-bit signals obtained by expressing, in 1 bit, the analog output I signal (the analog signal component including the phase information of the output signal) and the analog output-side comparison result signal (the analog signal component including the power information of the output signal). Therefore, the distortion compensation section 3 can perform the distortion compensation without using an A/D converter for converting the analog output signal y into a digital signal. As a result, since an A/D converter that causes an increase in cost need not be used even when a broadband signal is processed, cost reduction can be achieved.

The amplifier device 1 of the present embodiment includes the separation section 9 instead of an A/D converter, included in a conventional distortion compensation device, for converting an output signal from an amplifier obtained as a feedback signal into a digital signal.

Therefore, if the cost of the separation section 9 is higher than the cost of the A/D converter, cost reduction cannot be achieved.

Regarding this point, for example, an A/D converter capable of processing a signal having a bandwidth of 100 MHz needs to generate a very high sampling frequency, and thereby requires a very high operating frequency such as several 100 MHz. Therefore, generally, such an A/D converter is expensive as a device.

On the other hand, in the separation section 9 included in the amplifier device 1 of the present embodiment, it is only necessary for the comparator 17 to obtain a frequency required for generating the pattern V(t) for setting the offset value.

As described above, since the cycle C of the pattern V(t) is several Hz, an operating frequency required to generate the pattern V(t) is only several kHz. In contrast to the case of the A/D converter, a very high operating frequency such as several 100 MHz is not required.

Therefore, the separation section 9 included in the amplifier device 1 of the present embodiment can be configured at a lower cost as a device as compared to the A/D converter.

Consequently, the amplifier device 1 of the present embodiment can achieve cost reduction by using the separation section 9 instead of the A/D converter.

Further, in the amplifier device 1, the separation section 9 includes the power detector 16 that detects the power of the output signal y, and the comparator 17 that outputs the comparison result signal indicating the result of comparison between the power of the output signal y and the offset value (comparison value) set for comparison with the output signal y, as an analog signal component including power information of the output signal. The comparator 17 is configured to temporally vary the offset value within a predetermined numerical value range.

In this case, the distortion compensation section 3 performs distortion compensation for the amplifier, based on the analog output I signal and the analog output-side comparison result signal.

The distortion compensation section 3 can obtain, from the output I signal, at least information relating to the phase of the output signal y.

That is, in the present embodiment, the first signal port 20 of the distortion compensation section 3 is configured to receive the analog output I signal, and output a 1-bit digital signal (a 1-bit signal of the output I signal) including "+1" or "−1" as sign information. Therefore, the 1-bit signal of the output I signal includes information relating to the phase of the output I signal.

Thus, the distortion compensation section 3 can obtain, from the output I signal, the information relating to the phase of the output signal y.

Further, the output-side comparison result signal represents the magnitude of the power of the output signal y when the offset value is used as a reference. Therefore, if the output-side comparison result signal is compared with the input-side comparison result signal corresponding to the output-side comparison result signal, it is possible to know the degree of approximation between the power of the output signal y and the power of the input signal x when the offset value is used as a reference.

Figure 3:
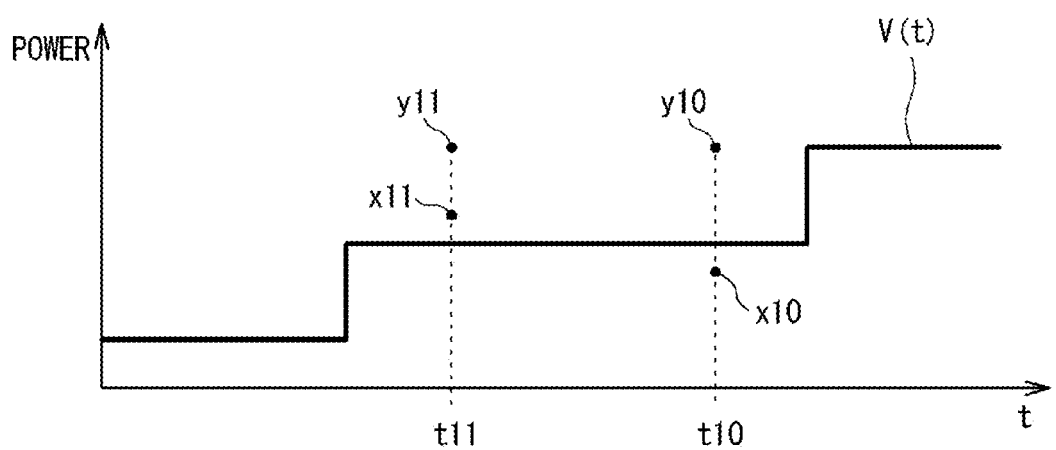
FIG. 3 is a diagram illustrating a relationship between power of an output signal y and power of an input signal x with the offset value as a reference.

FIG. 3 is a diagram showing the relationship between the power of the output signal y and the power of the input signal x when the offset value is used as a reference. In FIG. 3, the horizontal axis represents time, and the vertical axis represents power.

For example, in FIG. 3, if the power of an output signal y10 at time t10 is greater than the offset value V(t10) and the power of an input signal x10 corresponding to the output signal y10 is smaller than the offset value V(t10), the sign information of the output-side comparison result signal is "+1" and the sign information of the input-side comparison result signal is "−1".

Thus, when the sign information of the output-side comparison result signal and the sign information of the input-side comparison result signal are different from each other, it is at least found that the power of the output signal y and the power of the input signal x are different values across the offset value.

On the other hand, in FIG. 3, if the power of the output signal y10 at time t11 is greater than the offset value V(t10) and the power of the input signal x10 corresponding to the output signal y10 is greater than the offset value V(t10), the sign information of the output-side comparison result signal is "+1", and the sign information of the input-side comparison result signal is "+1".

Thus, when the sign information of the output-side comparison result signal and the sign information of the input-side comparison result signal are the same, it is at least found that the power of the output signal y and the power of the input signal x have the same magnitude relationship with respect to the offset value.

As described above, when the sign information of the output-side comparison result signal and the sign information of the input-side comparison result signal are different from each other, since the power of the output signal y and the power of the input signal x are different values across the offset value, it can be determined that the value of the power of the output signal y and the value of the power of the input signal x are relatively apart from each other. Therefore, it can be said that the degree of approximation between the power of the output signal y and the power of the input signal x is low.

On the other hand, when the sign information of the output-side comparison result signal and the sign information of the input-side comparison result signal are the same, the power of the output signal y and the power of the input signal x have the same magnitude relationship with respect to the offset value, and are basically approximate to each other because the output signal y and the input signal x correspond to each other. Therefore, in this case, it can be said that the degree of approximation between the power of the output signal y and the power of the input signal x is higher than that in the case where the sign information of the output-side comparison result signal and the sign information of the input-side comparison result signal are different from each other.

As described above, by comparing the output-side comparison result signal with the input-side comparison result signal corresponding to the output-side comparison result signal, it is possible to know the degree of approximation between the power of the output signal y and the power of the input signal x when the offset value is used as a reference.

Furthermore, since the comparator 17 temporally varies the offset value as a reference within the predetermined numerical value range, it is possible to know the degree of approximation between the power of the output signal and the power of the input signal within the predetermined numerical value range.

Thus, the distortion compensation section 3 can obtain, from the output-side comparison result signal, information relating to the power of the output signal y which allows the distortion compensation section 3 to know the degree of approximation with the power of the input signal x.

As described above, the distortion compensation section 3 can obtain, from the analog output I signal and the analog output-side comparison result signal, information relating to the phase of the output signal y and information relating to the power of the output signal y.

As described above, the separation section 9 can output the output-side comparison result signal as an analog signal component including power information of the output signal.

The distortion compensation section 3 compares, based on these pieces of information, the output signal and the input signal to obtain a residual between them, and performs distortion compensation based on the residual. As a result, the accuracy of the distortion compensation can be further improved while realizing cost reduction.

Furthermore, in the amplifier device 1, in the pattern V(t) (FIG. 2) for temporally varying the offset value, a plurality of retention periods L each for retaining the offset value constant during a predetermined time period are provided in each cycle, and different offset values are set for the respective retention periods L. Therefore, in each retention period L, more comparison result signals can be obtained under the condition that the offset value is constant, and thus the accuracy of the information relating to the power of the output signal y can be further improved.

When an offset value is changed from a value to another value, change in the actual value may be delayed with respect to change in the value to be set, which may cause an error in the offset value. In this regard, according to the present embodiment, since the retention periods L each for retaining the offset value constant for the predetermined time period are provided, the offset value can be made stable and free from error in the middle of each retention period L. Therefore, by excluding signals included in a part of the retention period L where error occurs in the offset value, and using, for processing, only signals in the other part of the retention period L, it is possible to prevent the comparison result signal obtained by using the offset value including the error from being outputted. As a result, the accuracy of the distortion compensation can be further improved.

5. Modifications

In the above-described embodiment, the separation section 9 separates the output signal y into the output I signal as an analog signal component including phase information of the output signal, and the output-side comparison result signal as an analog signal component including power information of the output signal y. However, for example, the separation section 9 may extract, from the output signal y, a signal which does not include another signal component intersecting on a complex plane, as an analog signal component including phase information of the output signal y, and may use, for example, the output Q signal, or a signal obtained by adding the output I signal and the output Q signal and encoding the result of the addition.

Also in this case, the distortion compensation section 3 can obtain at least information relating to the phase of the output signal y, based on the 1-bit signal obtained by expressing, in 1 bit, the analog signal component including phase information of the output signal y.

Figure 4A:
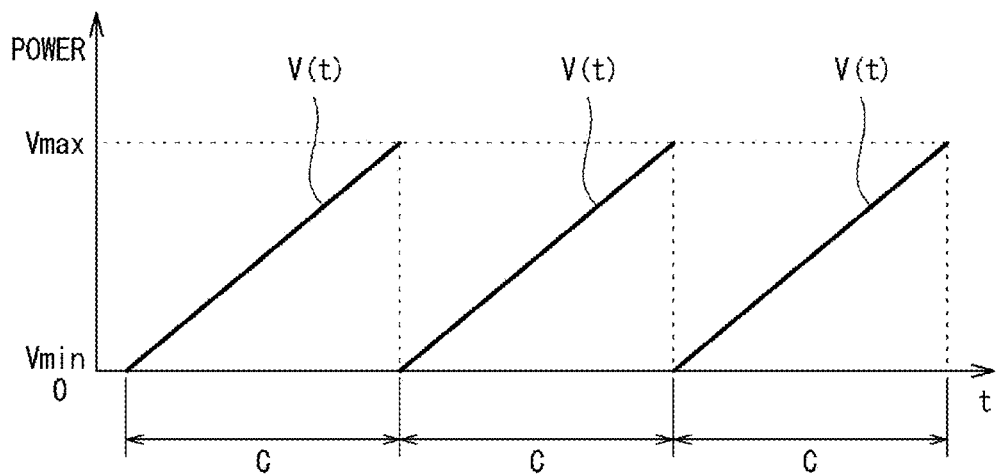
FIG. 4A is a diagram illustrating another example of the pattern of the offset value.

Furthermore, in the above embodiment, the pattern V(t) of the offset value which is used for comparison with the power of the output signal (power of the input signal) is gradually increased stepwise within the predetermined numerical value range (refer to FIG. 2). However, as shown in FIG. 4A, the pattern V(t) of the offset value may be set so that the offset value is increased linearly with respect to time.

Figure 4B:
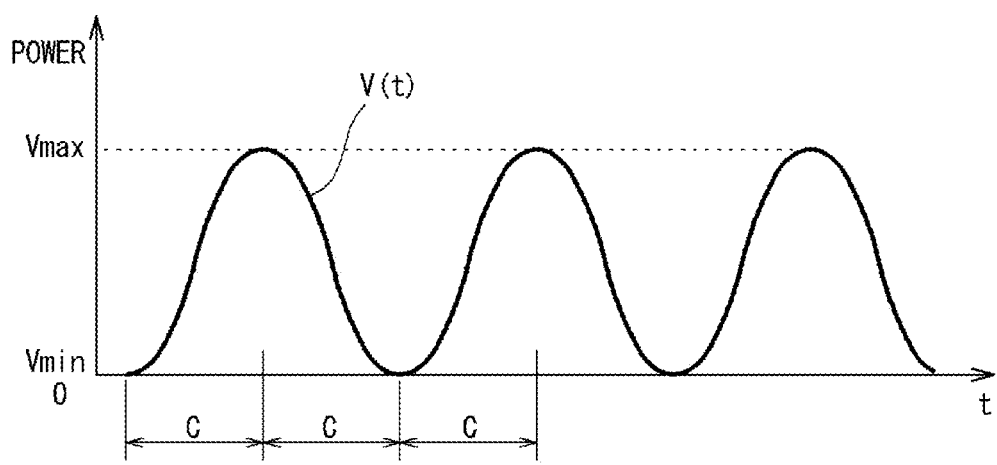
FIG. 4B is a diagram illustrating the other example of the pattern of the offset value.

Alternatively, as shown in FIG. 4B, the pattern V(t) may be a sine curve. In this case, a cycle C as the pattern V(t) may be set to ¼ wavelength of a sine curve which covers at least from the minimum value Vmin to the maximum value Vmax of the offset value, or more.

Figure 5:
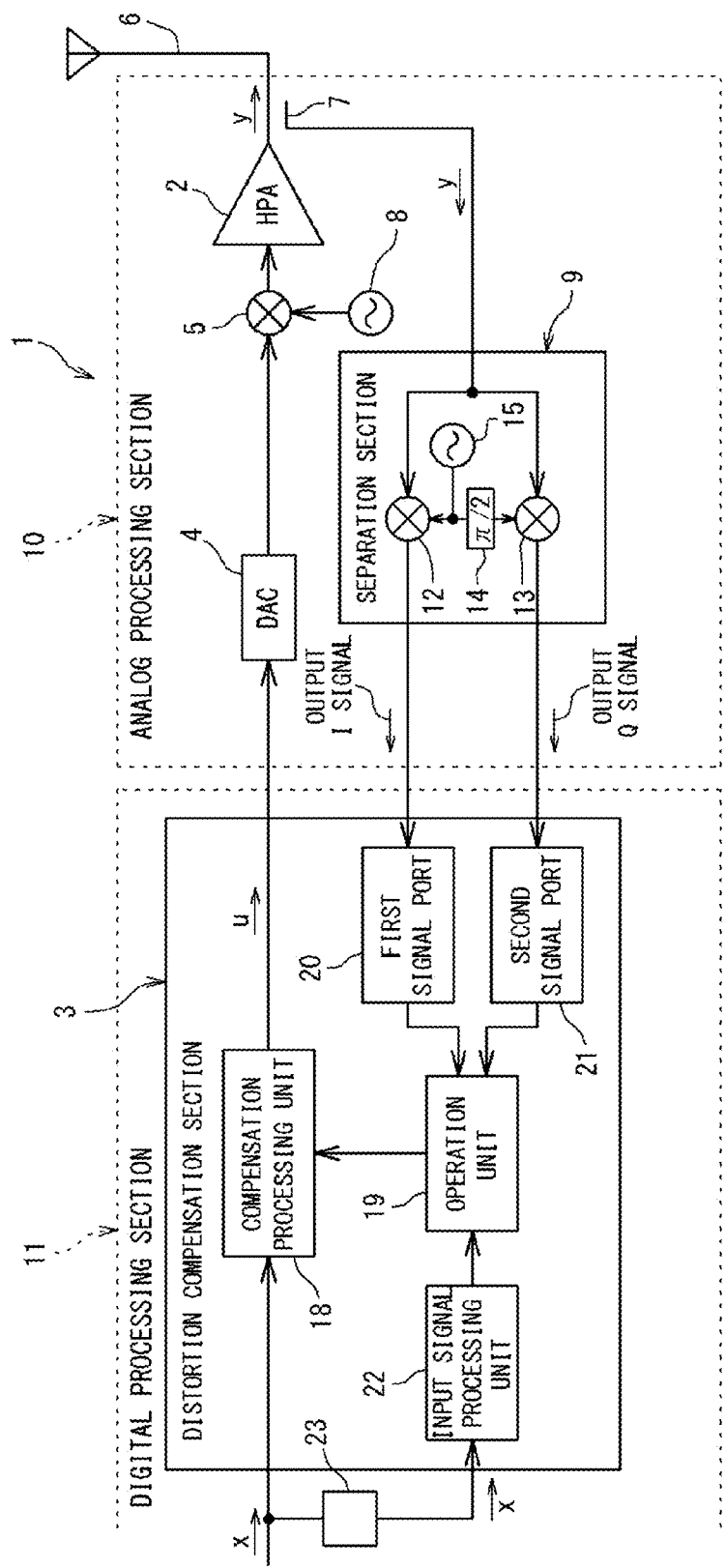
FIG. 5 is a block diagram illustrating a wireless communication device including an amplifier device according to a modification.

FIG. 5 is a block diagram illustrating a wireless communication device including an amplifier device according to a modification.

In the above embodiment, the separation section 9 includes the power detector 16 and the comparator 17 to separate the output signal y into the output I signal and the output-side comparison result signal. However, as shown in FIG. 5, the separation section 9 may not include the power detector 16 and the comparator 17, and the first down-converter 12 and the second down-converter 13 may separate the output signal y into an analog output I signal and an analog output Q signal, and output the analog output I signal and the analog output Q signal to the distortion compensation section 3.

In this configuration, the second signal port 21 of the distortion compensation section 3 receives the output Q signal as an analog signal, and provides a 1-bit digital signal (a 1-bit signal of the output Q signal) based on the output Q signal to the operation unit 19, in like manner as the first signal port 20.

The input signal processing unit 22 in the distortion compensation section 3 provides the operation unit 19 with, as the input-side 1-bit signal, a 1-bit signal of the input I signal and a 1-bit signal of the input Q signal.

The operation unit 19 estimates an inverse model of the amplifier 2 and performs distortion compensation, based on the 1-bit signal of the output I signal, the 1-bit signal of the output Q signal, the 1-bit signal of the input I signal, and the 1-bit signal of the input Q signal.

Also in this case, the distortion compensation section 3 can obtain at least information relating to the phase of the output signal, based on the 1-bit signals obtained by expressing, in 1 bit, the analog output I signal and the analog output Q signal, respectively. Therefore, upon obtaining, from the input signal, the information relating to the phase thereof, the distortion compensation section 3 can obtain information relating to a phase difference between the output signal and the input signal, and can perform distortion compensation based on the information relating to the phase difference.

6. Evaluation Test of Distortion Compensation

The amplifier device 1 of the present embodiment includes the separation section 9 instead of the A/D converter of the conventional distortion compensation device, which converts an output signal from an amplifier obtained as a feedback signal into a digital signal.

The inventor of the present invention has verified the signal input-output characteristics of the amplifier device 1 of the present embodiment and evaluated the accuracy of distortion compensation by the amplifier device of the present embodiment, in order to confirm that the accuracy of distortion compensation by the amplifier device 1 of the present embodiment is not inferior to that of the conventional distortion compensation device. The result of the evaluation is as follows.

In the evaluation test, the modes of input and output signals when an OFDM signal having a bandwidth of 100 MHz was amplified using the amplifier device 1 of the present embodiment shown in FIG. 1 were obtained by simulation using a computer to know the input-output characteristics in the amplifier device, and the accuracy of distortion compensation was evaluated based on the input-output characteristics.

Figure 6A:
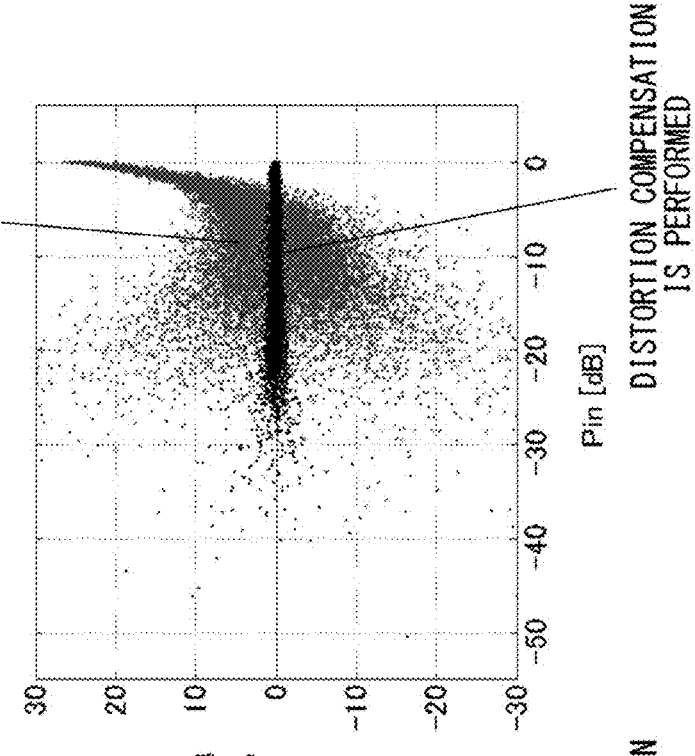
FIG. 6A is a graph illustrating an example of input-output characteristics of the amplifier device according to the present embodiment, illustrating AM-AM characteristics.
Figure 6B:
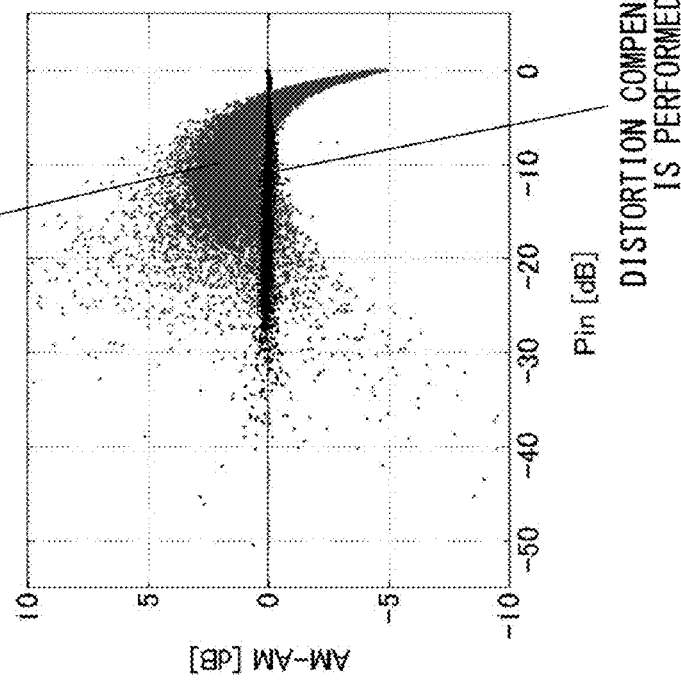
FIG. 6B is a graph illustrating an example of input-output characteristics of the amplifier device according to the present embodiment, illustrating AM-PM characteristics.

FIG. 6A and FIG. 6B show graphs illustrating examples of input-output characteristics in the amplifier device of the present embodiment, wherein FIG. 6A is a graph illustrating AM (Amplitude Modulation)-AM characteristics, and FIG. 6B is a graph illustrating AM-PM (Phase Modulation) characteristics.

In FIG. 6A, the horizontal axis represents the amplitude of the input signal, and the vertical axis represents the amplitude of the output signal. FIG. 6A is a scatter graph with respect to the amplitude of each input signal. In FIG. 6A, the result of distortion compensation performed by the amplifier device of the present embodiment is represented by dots of thick color, and the result of the case where no distortion compensation was performed on the input signal is represented by dots of thin color.

Referring to FIG. 6A, in the case where no distortion compensation is performed, the output amplitude diverges in the region where the amplitude is relatively small, while distortion due to saturation appears in the region where the amplitude is relatively large.

In contrast, in the case where distortion compensation is performed, distortion due to saturation, which has appeared in the region where the amplitude is relatively large, is resolved, and distortion in the input-output characteristics is resolved over substantially the entire region, and the output amplitude appears substantially linearly with respect to the input amplitude.

In FIG. 6B, the horizontal axis represents the amplitude of the input signal, and the vertical axis represents the phase difference between the input signal and the output signal. FIG. 6B is a scatter graph with respect to the amplitude of each input signal. In FIG. 6B, the result of distortion compensation performed by the amplifier device of the present embodiment is represented by dots of thick color, and the result of the case where no distortion compensation was performed on the input signal is represented by dots of thin color.

It is found from FIG. 6B that, in the case where distortion compensation is performed, there is substantially no change in the phase difference with respect to the amplitude of the input signal, as compared to the case where no distortion compensation is performed.

As described above, it is found that, in the amplifier device of the present embodiment, phase distortion and amplitude distortion with respect to the input amplitude are sufficiently compensated for.

Figure 7B:
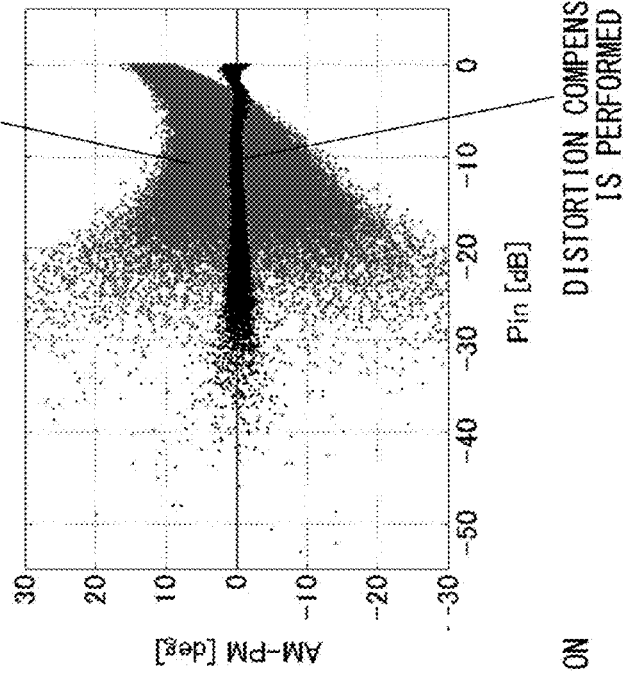
FIG. 7B is a graph illustrating an example of input-output characteristics of the amplifier device according to the modification, which graph illustrates AM-PM characteristics.
Figure 7A:
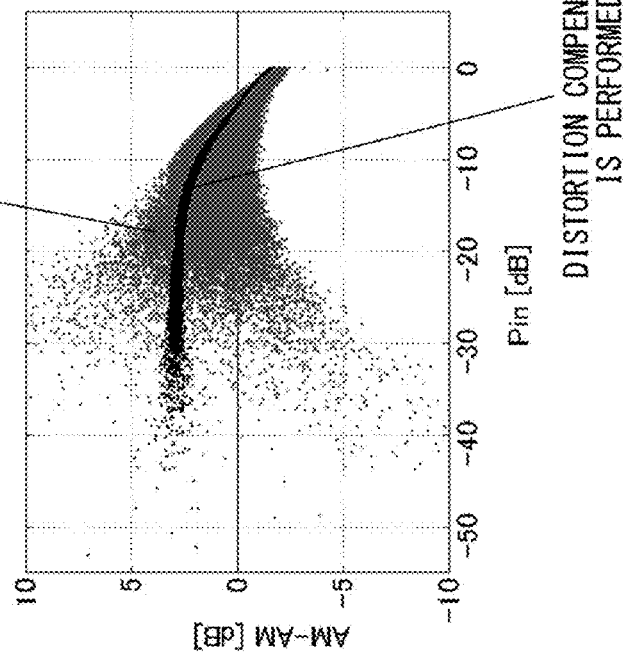
FIG. 7A is a graph illustrating an example of input-output characteristics of the amplifier device according to the modification, which graph illustrates AM-AM characteristics.

FIG. 7A and FIG. 7B show graphs illustrating examples of input-output characteristics of an amplifier device according to a modification, wherein FIG. 7A is a graph illustrating AM-AM characteristics, and FIG. 7B is a graph illustrating AM-PM characteristics.

Referring to FIG. 7A, even if distortion compensation is performed, distortion due to saturation, which appears in the region where the amplitude is relatively great, is not sufficiently resolved.

However, it is found from FIG. 7B that, when distortion compensation is performed, there is substantially no change in the phase difference with respect to the amplitude of the input signal, as compared to the case where distortion compensation is not performed.

As described above, it is found that, in the amplifier device according to the modification, phase distortion with respect to the input amplitude is sufficiently compensated for although slight distortion occurs in the output amplitude corresponding to the input amplitude.

Figure 8:
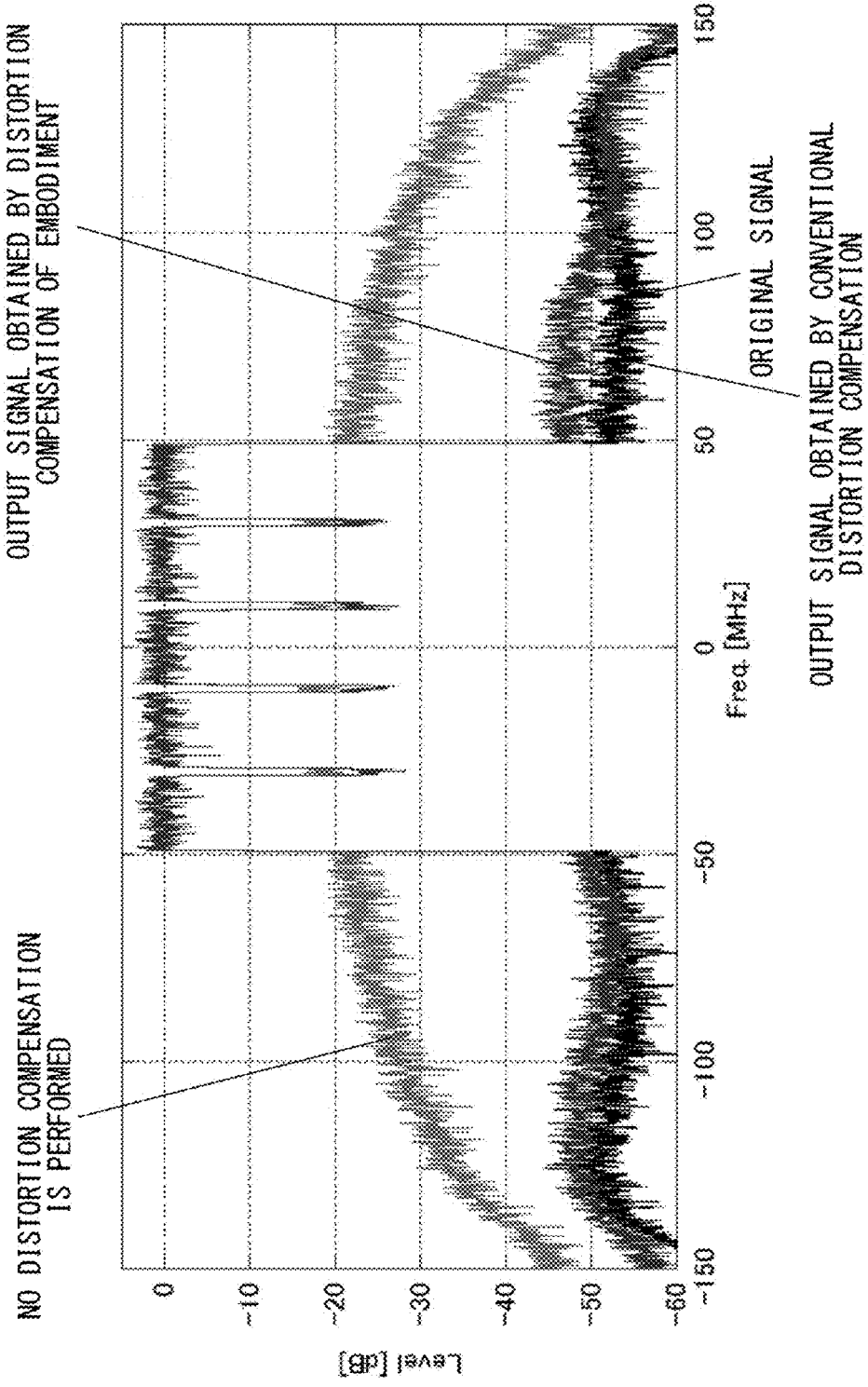
FIG. 8 is a diagram illustrating an example of a frequency spectrum of an OFDM signal amplified by the amplifier device according to the present embodiment.

FIG. 8 is a diagram illustrating an example of a frequency spectrum of an OFDM signal amplified by the amplifier device according to the present embodiment.

In FIG. 8, "original signal" means an input signal, and indicates a frequency spectrum of the input signal.

Further, in FIG. 8, "output signal caused by conventional distortion compensation" means an output signal obtained when distortion compensation is performed by the conventional distortion compensation device including an A/D converter for converting an output signal from an amplifier obtained as a feedback signal into a digital signal, and indicates a frequency spectrum of the output signal.

Further, "no distortion compensation" means an output signal obtained when the input signal is amplified without distortion compensation, and indicates a frequency spectrum of the output signal.

Further, "output signal caused by distortion compensation of the present embodiment" means an output signal obtained by distortion compensation by the amplifier device of the present embodiment, and indicates a frequency spectrum of the output signal.

It is found from FIG. 8 that the output signal caused by the distortion compensation of the present embodiment is improved in the adjacent channel leakage ratio (ACLR) between adjacent channels in the signal band, as compared to the output signal obtained without performing distortion compensation.

Further, it is found that the ACLR of the output signal caused by the distortion compensation of the present embodiment is substantially not inferior to that of the original signal or that of the output signal caused by the conventional distortion compensation, and is suppressed to a practically acceptable level.

As the result of the above-described evaluation test, it is confirmed that the amplifier device of the present embodiment has sufficient accuracy of distortion compensation, and the accuracy of distortion compensation by the amplifier device 1 of the present embodiment is not inferior to the conventional distortion compensation device.

The embodiments described above are to be considered in all respects as illustrative and not restrictive. The scope of the present invention is indicated by the appended claims rather than by the foregoing meaning, and all changes which come within the meaning and range of equivalency of the claims are therefore intended to be embraced therein.

REFERENCE SIGNS LIST 1 amplifier device
2 amplifier
3 distortion compensation section
4 D/A converter
5 up-converter
6 antenna
7 coupler
8 oscillator
9 separation section
10 analog processing section
11 digital processing section
12 first down-converter
13 second down-converter
14 phase shifter
15 oscillator
16 power detector
17 comparator
18 compensation processing unit
19 operation unit
20 first signal port
21 second signal port
22 input signal processing unit
23 delay adjustment section

The invention claimed is:

1. An amplifier device comprising:
an amplifier;
a distortion compensation section configured to perform distortion compensation for an input signal to the amplifier by digital signal processing; and
a separation section configured to separate an output signal from the amplifier into an analog signal component including phase information of the output signal, and an analog signal component including power information of the output signal, wherein
the separation section includes a power detector configured to detect power of the output signal and to output the analog signal component including power information of the output signal, and
the distortion compensation section performs the distortion compensation for the amplifier, based on 1-bit signals obtained by expressing, in 1 bit, the analog signal component including the phase information of the output signal and the analog signal component including the power information of the output signal output by the power detector, respectively.

2. An amplifier device comprising:
an amplifier;
a distortion compensation section configured to perform distortion compensation for an input signal to the amplifier by digital signal processing; and
a separation section configured to separate an output signal from the amplifier into an analog signal component including phase information of the output signal, and an analog signal component including power information of the output signal, wherein
the distortion compensation section performs the distortion compensation for the amplifier, based on 1-bit signals obtained by expressing, in 1 bit, the analog signal component including the phase information of the output signal and the analog signal component including the power information of the output signal, respectively, the separation section includes:

a power detector configured to detect power of the output signal; and a comparator configured to output a comparison result signal indicating a result of comparison between the power of the output signal and a comparison value set for comparison with the output signal, as the analog signal component including the power information of the output signal, wherein the comparator temporally varies the comparison value within a predetermined numerical value range.

3. The amplifier device according to claim 2, wherein the comparator varies the comparison value cyclically in the same pattern.

4. The amplifier device according to claim 3, wherein in the pattern for cyclically varying the comparison value, a plurality of retention periods each for retaining the comparison value constant during a predetermined time period are provided in each cycle, and different comparison values are set for the respective retention periods.

5. The amplifier device according to claim 2, wherein the analog signal component including the phase information of the output signal is composed of a signal which does not include another signal component intersecting on a complex plane.

6. The amplifier device according to claim 2, wherein the analog signal component including the phase information of the output signal is an analog I signal or an analog Q signal.

7. A wireless communication device including the amplifier device according to claim 1 for amplification of a communication signal.

8. A wireless communication device including the amplifier device according to claim 2 for amplification of a communication signal.

* * * * *